(12) United States Patent
Abe

(10) Patent No.: US 7,759,920 B2
(45) Date of Patent: Jul. 20, 2010

(54) SWITCHING REGULATOR AND SEMICONDUCTOR DEVICE HAVING THE SAME

(75) Inventor: Hirohisa Abe, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 273 days.

(21) Appl. No.: 11/941,710

(22) Filed: Nov. 16, 2007

(65) Prior Publication Data

US 2008/0150505 A1 Jun. 26, 2008

(30) Foreign Application Priority Data

Dec. 20, 2006 (JP) ............................... 2006-342506

(51) Int. Cl.
*G05F 1/00* (2006.01)
(52) U.S. Cl. ...................................... 323/282
(58) Field of Classification Search .......... 323/282–285
See application file for complete search history.

(56) References Cited

U.S. PATENT DOCUMENTS

| 4,428,015 | A | * | 1/1984 | Nesler | 361/18 |
| 4,428,016 | A | * | 1/1984 | Brasfield | 361/18 |
| 5,438,499 | A | * | 8/1995 | Bonte et al. | 363/21.16 |
| 5,847,554 | A | * | 12/1998 | Wilcox et al. | 323/282 |
| 5,973,551 | A | * | 10/1999 | Mitsuda | 327/543 |
| 6,859,423 | B1 | * | 2/2005 | Yoshikawa | 369/30.27 |
| 7,250,746 | B2 | * | 7/2007 | Oswald et al. | 323/284 |
| 7,294,992 | B2 | * | 11/2007 | Yoshikawa | 323/222 |
| 7,315,151 | B2 | * | 1/2008 | Thompson et al. | 323/223 |
| 7,471,072 | B2 | * | 12/2008 | Fogg et al. | 323/284 |
| 7,492,132 | B2 | * | 2/2009 | Kuroiwa et al. | 323/222 |
| 7,595,623 | B2 | * | 9/2009 | Bennett | 323/288 |
| 2006/0220623 | A1 | * | 10/2006 | Andruzzi et al. | 323/276 |
| 2007/0014064 | A1 | * | 1/2007 | Souma | 361/91.7 |
| 2008/0088289 | A1 | * | 4/2008 | Fogg et al. | 323/283 |

FOREIGN PATENT DOCUMENTS

| JP | 58-157151 | 9/1983 |
| JP | 64-1052 | 1/1989 |
| JP | 2003-69409 | 3/2003 |
| JP | 2006-311646 | 11/2006 |

\* cited by examiner

*Primary Examiner*—Adolf Berhane
*Assistant Examiner*—Yemane Mehari
(74) *Attorney, Agent, or Firm*—Dickstein Shapiro LLP

(57) ABSTRACT

A switching regulator and a semiconductor device having the same are disclosed, the switching regulator being capable of preventing turn-ON of a switching transistor when the connection between a control circuit controlling the operation of the switching transistor and ground potential is cut off. The switching regulator includes, for example, an NMOS transistor that is turned OFF to decrease the gate voltage of the switching transistor to turn off the switching transistor to be electrically non-conducting when the connection between a first ground terminal and ground potential is cut off by, for example, the disconnection between the first ground terminal and the ground line of the printed circuit board.

18 Claims, 5 Drawing Sheets

SWITCHING REGULATOR AND SEMICONDUCTOR DEVICE HAVING THE SAME

BACKGROUND OF THE INVENTION

1. Field of the Invention

The present invention generally relates to a switching regulator and a semiconductor device having the same and, more particularly, to a switching regulator and a semiconductor device having the same, each having plural wiring lines electrically connected to ground potential and a protection circuit capable of preventing the occurrence of trouble when any one of the wiring lines connected to ground potential is electrically interrupted, thereby continuously applying an input voltage to the switching regulator.

2. Description of the Related Art

Conventionally, a typical semiconductor device has its plural ground terminals. For example, in a typical semiconductor device having an analog circuit and a digital circuit, both circuits being integrated in the same IC chip, the ground line of the analog circuit and the ground line of the digital circuit are electrically connected to each other not in the IC chip but outside the semiconductor device through their separate terminals to prevent superimposition of the switching noise generated in the digital circuit on the signals in the analog circuit through the ground line.

Further, when a large-scale integrated circuit including a logic circuit unit having logic gates and a buffer circuit unit having an input and an output connected to an external circuit and being capable of driving a large current is used, there is a known technique in that the logic circuit unit and the buffer circuit unit have separate ground lines and are connected to separate external power circuits to prevent malfunction of the logic circuit unit due to an increase of the ground line voltage caused by a large current flowing during the switching operation of the buffer circuit unit (see, for example, Japanese Patent Publication No. S64-1052).

FIG. 5 shows an exemplary circuit diagram of a conventional chopper-type step-up switching regulator.

In FIG. 5, a switching regulator 100 includes a control semiconductor device 101, an inductor L101, a rectifying diode D101, an output capacitor C101, and resisters R101 and R102 for detecting output voltage.

Further, the control semiconductor device 101 includes a switching transistor M101 constituted of an NMOS transistor and a control circuit 102 generating and outputting a control voltage Vg to turn ON/OFF the switching transistor M101. The control semiconductor device 101 further includes a power terminal Vdd, an inductor connecting terminal Lx, a feedback terminal FB inputting a voltage proportional to the output voltage of the switching regulator, a first ground terminal GND1 of the control circuit 102, and a second ground terminal GND2 of the switching transistor M101.

When the switching transistor M101 performs a switching operation, a large current flows to the ground line, and the voltage of the ground line fluctuates. Because of this feature, to prevent the degradation of the accuracy of an analog circuit operation in the control circuit 102 and the malfunction of the digital circuit, a ground terminal is divided into the first ground terminal GND1 and the second ground terminal GND2 and both terminals are connected to each other through a wiring line on, for example, a printed circuit board on which is mounted the control semiconductor device 101.

However, when the control semiconductor device 101 and its peripheral parts are mounted on, for example, a printed circuit board, if the first ground terminal GND1 is not connected to ground potential GND due to a poor connection, and a voltage is applied to the input terminal IN of the switching regulator 100, the control circuit 102 may not operate due to the disconnection between the first ground terminal GND1 and ground potential GND and the control voltage Vg output from the control circuit 102 may be increased. Further, when the control voltage Vg exceeds the gate threshold voltage of the switching transistor M101, the switching transistor M101 is disadvantageously turned ON to be electrically conducting.

As shown in FIG. 5, the inductor L101 and the switching transistor M101 are connected in series between the input terminal IN and ground potential GND of the printed circuit board. Further, since a large current flows through the switching transistor M101, the on-resistance of the switching transistor M101 is typically very low. Also, the DC resistance of the inductor L101 is low. Therefore, when the switching transistor M101 is turned ON, a large current continuously flows from the input terminal IN through the inductor L101 and the switching transistor M101. Unfortunately, as a result, a battery supplying power to the input terminal IN may be discharged and the inductor L101 and the switching transistor M101 may be overheated. Further, when this condition is prolonged, something may go wrong with the inductor L101 and the switching transistor M101.

SUMMARY OF THE INVENTION

The present invention is made to solve the problems and may provide a switching regulator and a semiconductor device having the same in which the switching transistor is prevented from turning ON when the connection between the control circuit controlling the operations of the switching transistor and ground potential is cut off or when poor connection occurs due to any other reason.

According to one aspect of the present invention, there is provided a switching regulator converting an input voltage input to an input terminal to a prescribed substantially constant voltage and outputting the converted voltage from an output terminal as an output voltage, the switching regulator including a switching transistor performing a switching operation based on a control signal input to the switching transistor; an inductor charged by the input voltage based on the switching operation of the switching transistor; a control circuit unit performing switching control of the switching transistor so that the output voltage output from the output terminal will be equal to the prescribed substantially constant voltage; a first ground terminal for connecting the control circuit unit to ground potential; a second ground terminal for connecting the switching transistor to ground potential; and a protection circuit unit for turning OFF the switching transistor to be electrically non-conducting regardless of the status of a control signal output from the control circuit unit when a disconnection between the first ground terminal and ground potential is detected.

According to another aspect of the present invention, the protection circuit unit determines that the connection between the first ground terminal and ground potential is cut off when the voltage of the first ground terminal is higher than the voltage of the second ground terminal by a prescribed value.

More specifically, the protection circuit unit includes a transistor having a control electrode connected to the first ground terminal, the transistor being turned ON when the connection between the first ground terminal and ground potential is cut off and the voltage of the first ground terminal is increased to apply a predetermined voltage to the control electrode of the switching transistor so that the switching transistor will be turned OFF to be electrically non-conducting.

According to still another aspect of the present invention, the protection circuit unit determines that the connection between the first ground terminal and ground potential is cut off when the voltage of the first ground terminal is equal to or higher than a first prescribed value.

In this case, the first prescribed value is less than a threshold voltage of the switching transistor.

According to still another aspect of the present invention, the protection circuit includes a voltage detection circuit comparing a voltage of the first ground terminal with the first prescribed value and outputting a signal representing the comparison result; and an output control circuit performing output control to control an output from the control circuit unit to the control electrode of the switching transistor based on the output signal from the voltage detection circuit, where the voltage detection circuit generates and outputs a prescribed error detection signal when the voltage of the first ground terminal is higher than the first prescribed value and, when the prescribed error detection signal is output from the voltage detection circuit, the output control circuit interrupts the output of a control signal from the control circuit unit to the control electrode of the switching transistor to turn OFF the switching transistor to be electrically non-conducting.

According to still another aspect of the present invention, the output control circuit level-shifts a signal to the control electrode of the switching transistor from a voltage referred to the voltage of the first ground terminal to a voltage referred to the voltage of the second ground terminal.

According to still another aspect of the present invention, one end of the inductor is connected to the input terminal; the switching transistor is connected to the junction between the other end of the inductor and the second ground terminal; and a rectifying device is connected between the junction between the other end of the inductor and the second ground terminal and the output terminal.

According to still another aspect of the present invention, the switching transistor, the control circuit unit, and the protection circuit unit are formed into a single IC; and each of the first ground terminal and the second ground terminal is connected to the corresponding terminal of the IC.

According to still another aspect of the present invention, there is provided a semiconductor device including a chopper-type switching regulator using an inductor, the switching regulator converting an input voltage input to an input terminal to a prescribed substantially constant voltage and outputting the converted voltage from an output terminal as an output voltage, the semiconductor device including a switching transistor performing a switching operation based on a control signal input to the switching transistor and causing the inductor to be charged by the input voltage; a control circuit unit performing switching control of the switching transistor so that the output voltage output from the output terminal will be equal to the prescribed substantially constant voltage; a first ground terminal for connecting the control circuit unit to ground potential; a second ground terminal for connecting the switching transistor to ground potential; and a protection circuit unit for turning OFF the switching transistor to be electrically non-conducting regardless of the status of a control signal output from the control circuit unit when a disconnection between the first ground terminal and ground potential is detected.

According to another aspect of the present invention, the protection circuit unit determines that the connection between the first ground terminal and ground potential is cut off when the voltage of the first ground terminal is higher than the voltage of the second ground terminal by a prescribed value.

More specifically, the protection circuit unit includes a transistor having a control electrode connected to the first ground terminal, the transistor being turned ON when the connection between the first ground terminal and ground potential is cut off and the voltage of the first ground terminal is increased to apply a predetermined voltage to the control electrode of the switching transistor so that the switching transistor will be turned OFF to be electrically non-conducting.

According to still another aspect of the present invention, the protection circuit unit determines that the connection between the first ground terminal and ground potential is cut off when the voltage of the first ground terminal is equal to or higher than a first prescribed value.

In this case, the first prescribed value is less than a threshold voltage of the switching transistor.

According to still another aspect of the present invention, the protection circuit includes a voltage detection circuit comparing a voltage of the first ground terminal with the first prescribed value and outputting a signal representing the comparison result; and an output control circuit performing output control to control an output from the control circuit unit to the control electrode of the switching transistor based on the output signal from the voltage detection circuit, where the voltage detection circuit generates and outputs a prescribed error detection signal when the voltage of the first ground terminal is higher than the first prescribed value and, when the prescribed error detection signal is output from the voltage detection circuit, the output control circuit interrupts the output of a control signal from the control circuit unit to the control electrode of the switching transistor to turn OFF the switching transistor to be electrically non-conducting.

According to still another aspect of the present invention, the output control circuit level-shifts a signal to the control electrode of the switching transistor from a voltage referred to the voltage of the first ground terminal to a voltage referred to the voltage of the second ground terminal.

According to still another aspect of the present invention, one end of the inductor is connected to the input terminal; the switching transistor is connected to the junction between the other end of the inductor and the second ground terminal; and a rectifying device is connected between the junction between the other end of the inductor and the second ground terminal and the output terminal.

According to still another aspect of the present invention, the switching transistor, the control circuit unit, and the protection circuit unit are formed into a single IC; and each of the first ground terminal and the second ground terminal is connected to the corresponding terminal of the IC.

In a switching regulator and a semiconductor device having the same according to an embodiment of the present invention, when the disconnection status between the voltage of the first ground terminal and ground potential is detected, the switching transistor is then turned OFF to be electrically non-conducting regardless of the level of the control signal output from the control circuit. Because of this feature, when the connection between the control circuit controlling the operations of the switching transistor and ground potential is cut off or when poor connection occurs due to any other reason, the switching transistor is controlled so as not to be turned ON, thereby preventing the flow of an unnecessary large current and the subsequent occurrence of trouble.

DETAILED DESCRIPTION OF THE PREFERRED EMBODIMENTS

In the following, a detailed description of embodiments of the present invention is provided with reference to the accompanying drawings.

First Embodiment

Figure 1:
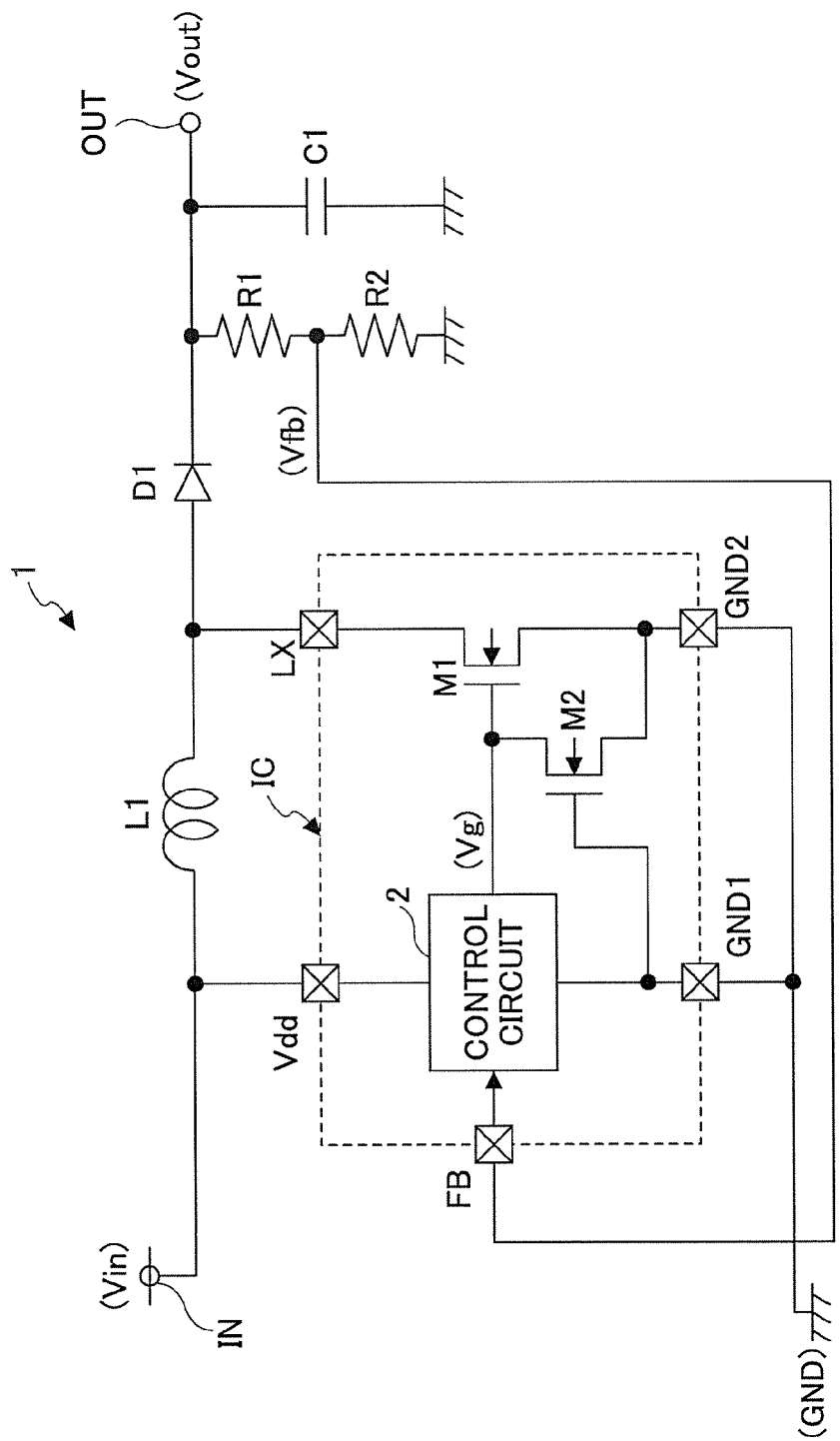
FIG. 1 is a schematic circuit diagram of an exemplary chopper-type step-up DC-DC converter according to a first embodiment of the present invention.

FIG. 1 shows a configuration of an exemplary switching regulator according to a first embodiment of the present invention.

In FIG. 1, a switching regulator 1 is a step-up switching regulator stepping up an input voltage Vin input to an input terminal IN to a prescribed voltage to be output as an output voltage Vout from an output terminal OUT.

The switching regulator 1 includes a switching transistor M1 constituted of an NMOS transistor, a rectifying diode D1, an NMOS transistor M2, an inductor L1, a capacitor C1, resistors R1 and R2 dividing the output voltage Vout to generate a divided voltage Vfb for detecting the output voltage, and a control circuit 2 controlling the operation of the switching transistor M1. It should be noted that the control circuit 2 and the NMOS transistor M2 constitute a control circuit unit and a protection circuit unit, respectively. Further, the switching transistor M1, the NMOS transistor M2, and the control circuit 2 are formed into a single integrated circuit (IC). The IC includes a power terminal Vdd, connection terminals LX and FB, a first ground terminal GND1, and a second ground terminal GND2, the first ground terminal GND1 and the second ground terminal GND2 being connected to each other outside the IC and being further connected to ground potential GND.

The inductor L1 and the rectifying diode D1 are connected in series between the input terminal IN and the output terminal OUT. The resistors R1 and R2 are connected in series between the output terminal OUT and ground potential GND and the capacitor C1 is also connected between the output terminal OUT and ground potential GND. The junction between the inductor L1 and the rectifying diode D1 is connected to the connection terminal LX. The switching transistor M1 is connected between the connection terminal Lx and the second ground terminal GND2. The NMOS transistor M2 is connected between the gate and the source of the switching transistor M1. The control voltage Vg from the control circuit 2 is applied to the gate of the switching transistor M1. The gate of the NMOS transistor M2 is connected to the first ground terminal GND1. Further, the control circuit 2 is connected to the power terminal Vdd, the first ground terminal GND1, and the junction between the resistors R1 and R2 through the connection terminal FB.

In this configuration, the output voltage Vout is maintained at a prescribed voltage by a method wherein the output voltage Vout is divided by the resistors R1 and R2 to generate the divided voltage Vfb and the control circuit 2 controls the operation of switching transistor M1 by, for example, the PWM control method so that the divided voltage Vfb will be maintained at a prescribed reference voltage. While the switching transistor M1 is turned ON to be electrically conducting, the inductor L1 is charged with energy. While the switching transistor MI is turned OFF to be electrically non-conducting, the energy in the inductor L1 is discharged so as to add to the input voltage Vin and be output from the output terminal OUT. As a result, the input voltage Vin is stepped up and is smoothed by the rectifying diode D1 and the capacitor C1 and output from the output terminal OUT as the output voltage Vout.

Next described is a case where the connection between the first ground terminal GND1 and ground potential GND is cut off by, for example, cutting off the connection between the first ground terminal GND1 and the ground line of the printed circuit board on which the IC is mounted.

In this case, since the input voltage Vin is input to the control circuit 2 via the power terminal Vdd, the voltage of the first ground terminal GND1 is increased. Because of this, the control voltage Vg is increased regardless of the operation of the control circuit 2 outputting a low-level signal to the gate of the switching transistor M1. When the control voltage Vg exceeds a threshold voltage Vth1 of the switching transistor M1, the switching transistor M1 is turned ON and a large current flows from the input terminal IN to the switching transistor M1 through the inductor L1.

However, in this embodiment, a threshold voltage Vth2 of the NMOS transistor M2 is arranged to be lower than the threshold voltage Vth1 of the switching transistor M1. Because of this arrangement, the NMOS transistor M2 is turned ON before the switching transistor M1 is turned ON, thereby decreasing the gate voltage of the switching transistor M1 and thus preventing turn-ON of the switching transistor M1.

As described above, in a switching regulator according to the first embodiment of the present invention, when the connection between the first ground terminal GND1 and ground potential GND is cut off by, for example, cutting off the connection between the first ground terminal GND1 and the ground line of the printed circuit board, the NMOS transistor is turned ON to decrease the gate voltage of the switching transistor M1 so as to prevent turn-ON of the switching transistor M1. Because of this feature, when the connection between the control circuit 2 and ground potential GND is cut off or when there is a poor connection for any reason, it is possible to prevent turn-on of the switching transistor M1.

Second Embodiment

In a second embodiment of the present invention, in place of the NMOS transistor used in the first embodiment of the present invention, a voltage detection circuit is used. The voltage detection circuit detects the voltage of the first ground terminal GND1 and outputs a signal to turn OFF the switching transistor M1 when the voltage of the first ground terminal GND 1 is increased.

Figure 2:
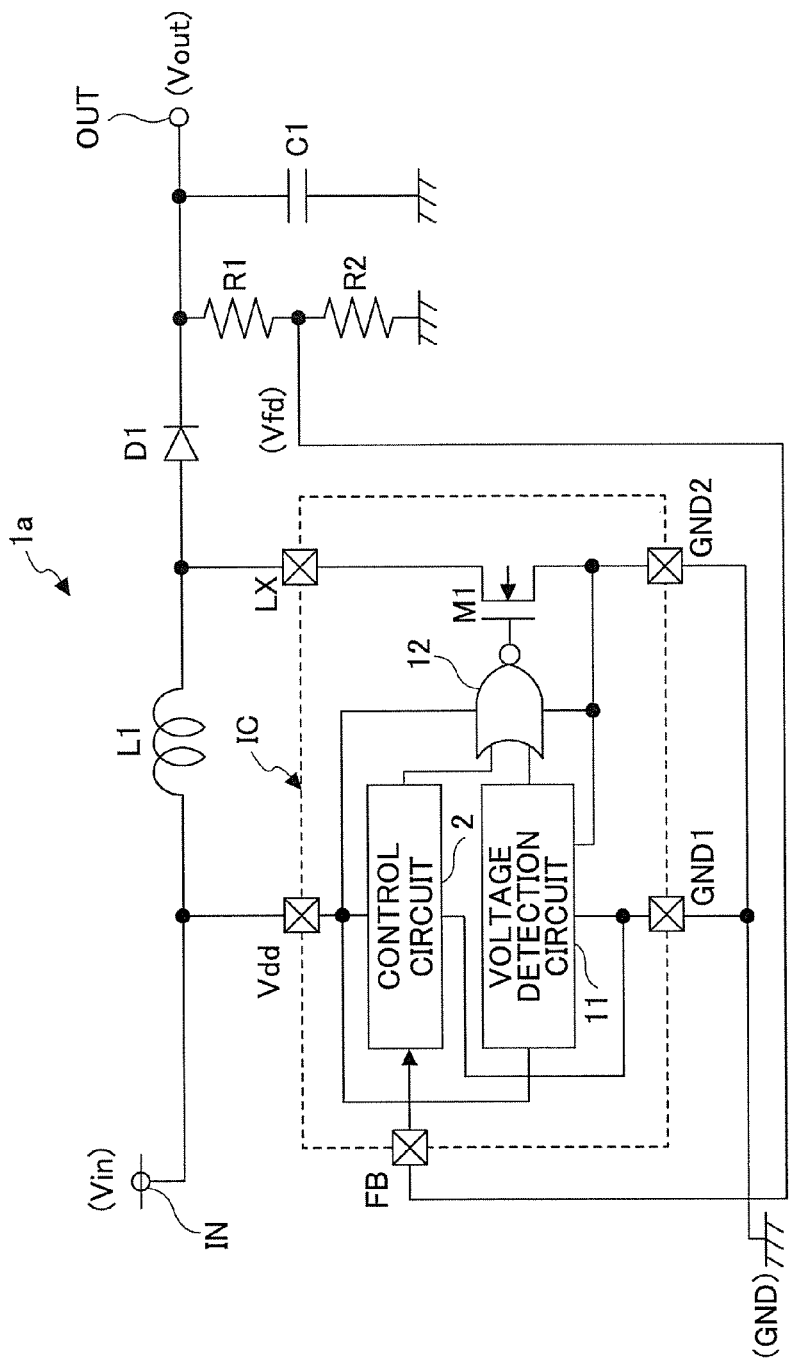
FIG. 2 is a schematic diagram showing an exemplary configuration of a switching regulator according to a second embodiment of the present invention.

FIG. 2 shows a configuration of an exemplary switching regulator according to the second embodiment of the present invention. In FIG. 2, the same reference numerals are used to refer to the same or similar parts as those in FIG. 1, and the descriptions of those parts are omitted. Namely, only a portion different from the configuration in FIG. 1 is described.

The portion in FIG. 2 different from that in FIG. 1 is a voltage detection circuit 11 and a NOR circuit 12 in place of the NMOS transistor M2 shown in FIG. 1. Along with this change, the reference numeral of the switching regulator is also changed from 1 (in FIG. 1) to 1a (in FIG. 2).

In FIG. 2, a switching regulator 1a is a step-up switching regulator stepping up an input voltage Vin input to an input terminal IN to a prescribed voltage to be output as an output voltage Vout from an output terminal OUT.

The switching regulator 1a includes the switching transistor M1, the rectifying diode D1, the inductor L1, the capacitor C1, the resistors R1 and R2, the control circuit 2, the voltage detection circuit 11 detecting the voltages of the first ground terminal GND1 and the second ground terminal GND2, and the NOR circuit 12.

It should be noted that the voltage detection circuit 11 and the NOR circuit 12 constitute the protection circuit unit, and the NOR circuit 12 constitutes the output control circuit unit. Further, the switching transistor M1, the control circuit 2, the voltage detection circuit 11 and the NOR circuit 12 are formed into a single IC. The IC includes the power terminal Vdd, connection terminals LX and FB, the first ground terminal GND1, and the second ground terminal GND2, the first ground terminal GND1 and the second ground terminal GND2 being connected to each other outside the IC and being further connected to ground potential GND.

A control signal from the control circuit 2 is input to one input terminal of the NOR circuit 12 and the output terminal of the NOR circuit 12 is connected to the gate of the switching transistor M1. The voltage detection circuit 11, receiving power through the power terminal Vdd, detects the voltages of the first ground terminal GND1 and the second ground terminal GND2 and outputs the detected result to the other input terminal of the NOR circuit 12. The NOR circuit 12 is connected to the power terminal Vdd and the second ground terminal GND2 to receive power.

In this configuration, when the voltage of the first ground terminal GND1 becomes equal to or greater than a prescribed first reference voltage Vs1, the voltage detection circuit 11 outputs a high-level signal to the corresponding input terminal of the NOR circuit 12. Each ground line of the voltage detection circuit 11 and the NOR circuit 12 as well as the source of the switching transistor M1 is connected to the second ground terminal GND2.

On the other hand, when the voltage of the first ground terminal GND1 is less than the prescribed first reference voltage Vs1, the voltage detection circuit 11 outputs a low-level signal to the corresponding input terminal of the NOR circuit 12. The first reference voltage Vs1 is arranged to be less than the threshold voltage of the switching transistor M1.

When the high-level signal from the voltage detection circuit 11 is input to the NOR circuit 12, the NOR circuit 12 outputs a low-level signal regardless of the status of the signal from the control circuit 2, thereby turning OFF the switching transistor M1 to be electrically non-conducting. On the other hand, when a low-level signal from the voltage detection circuit 11 is input to the NOR circuit 12, the NOR circuit 12 inverts the level of the input signal from the control circuit 2 and outputs the inverted signal to the gate of the switching transistor M1.

Figure 3:
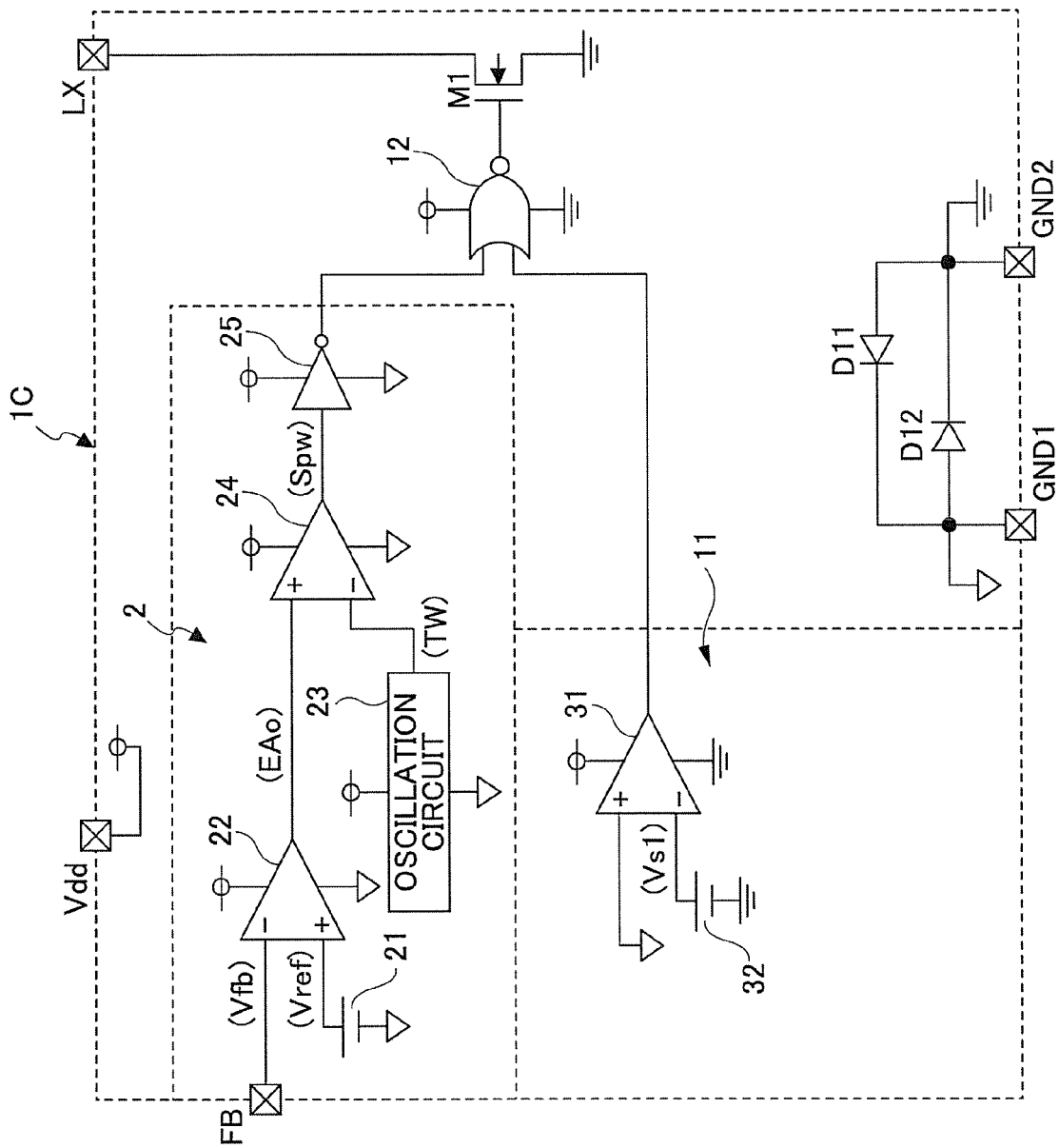
FIG. 3 is an exemplary circuit diagram of the switching regulator shown in FIG. 2.

FIG. 3 shows an exemplary circuit diagram of the switching regulator in FIG. 2.

In FIG. 3, the control circuit 2 includes a reference voltage generating circuit 21, a differential amplifier circuit 22, an oscillation circuit 23, a PWM comparator 24, and an inverter 25. Each of the reference voltage generating circuit 21, the differential amplifier circuit 22, the oscillation circuit 23, the PWM comparator 24, and the inverter 25 is connected to the power terminal Vdd and the first ground terminal GND1 to receive power. The reference voltage generating circuit 21 generates a prescribed reference voltage Vref. The inverting input of the differential amplifier circuit 22 receives the divided voltage Vfb through the connection terminal FB and the non-inverting input of the differential amplifier circuit 22 receives the prescribed reference voltage Vref. Then, the differential amplifier circuit 22 amplifies the difference between the divided voltage Vfb and the prescribed reference voltage Vref and outputs a signal based on the amplified voltage difference as an output signal EAo. The oscillation circuit 23 generates and outputs a prescribed triangle wave signal TW. The PWM comparator 24 generates and outputs a pulse signal Spw based on the output signal EAo from the differential amplifier circuit 22 and the triangle wave signal signal TW from the oscillation circuit 23 to perform PWM control. The pulse signal Spw is input to the corresponding input terminal of the NOR circuit 12 through the inverter 25.

The voltage detection circuit 11 includes a comparator 31 and a first reference voltage generating circuit 32 generating and outputting a first reference voltage Vs1. The comparator 31 is connected to the power terminal Vdd and the second ground terminal GND2 to receive power. Though not shown in FIG. 3, the first reference voltage generating circuit 32 is also connected to the power terminal Vdd and the second ground terminal GND2 to receive power. The non-inverting input of the comparator 31 is connected to the first ground terminal GND1. The inverting input of the comparator 31 is connected to the first reference voltage Vs1. The output terminal of the comparator 31 is connected to the corresponding input terminal of the OR circuit 12.

In this configuration, when the connection between the first ground terminal GND1 and ground potential GND is cut off, the voltage of the first ground terminal GND1 is increased and subsequently the output terminal of the comparator becomes a high level.

When the high-level signal from the comparator is input to the NOR circuit 12, the NOR circuit 12 outputs a low-level signal regardless of the status of the signal input from the inverter 25. Since the first reference voltage Vs1 is arranged to be less than the threshold voltage Vth1 of the switching transistor M1, the switching transistor M1 is never turned ON before the level of output signal of the comparator 31 becomes high.

Alternatively, as shown in FIG. 3, it may be arranged such that the voltage difference between the first ground terminal GND1 and the second ground terminal GND2 does not exceed the forward voltage of a diode D11 or a diode D12 by connecting the diodes D11 and D12 in a manner such that the cathode of the diode D11 and the anode of the diode D12 are connected to the first ground terminal GND1 and the cathode of the diode D12 and the anode of the diode D11 are connected to the second ground terminal GND2.

AS described above, in the switching regulator according to the second embodiment of the present invention, since the voltage detection circuit 11 detects the voltage of the first ground terminal GND1 and outputs a signal to turn OFF the switching transistor M1 when the detected voltage of the first ground terminal GND1 is increased, the same effect as that in the first embodiment of the present invention can be obtained.

Third Embodiment

As described above, in the second embodiment of the present invention, it is arranged that a signal having an amplitude between the input voltage Vin and the voltage of the first ground terminal GND1 is transmitted from the control circuit 2 to be input to the NOR circuit 12. In a third embodiment of the present invention, the amplitude of the signal of the circuit of the second embodiment is level-shifted so that the signal has an amplitude between the input voltage Vin and the voltage of the second ground terminal GND2.

Figure 4:
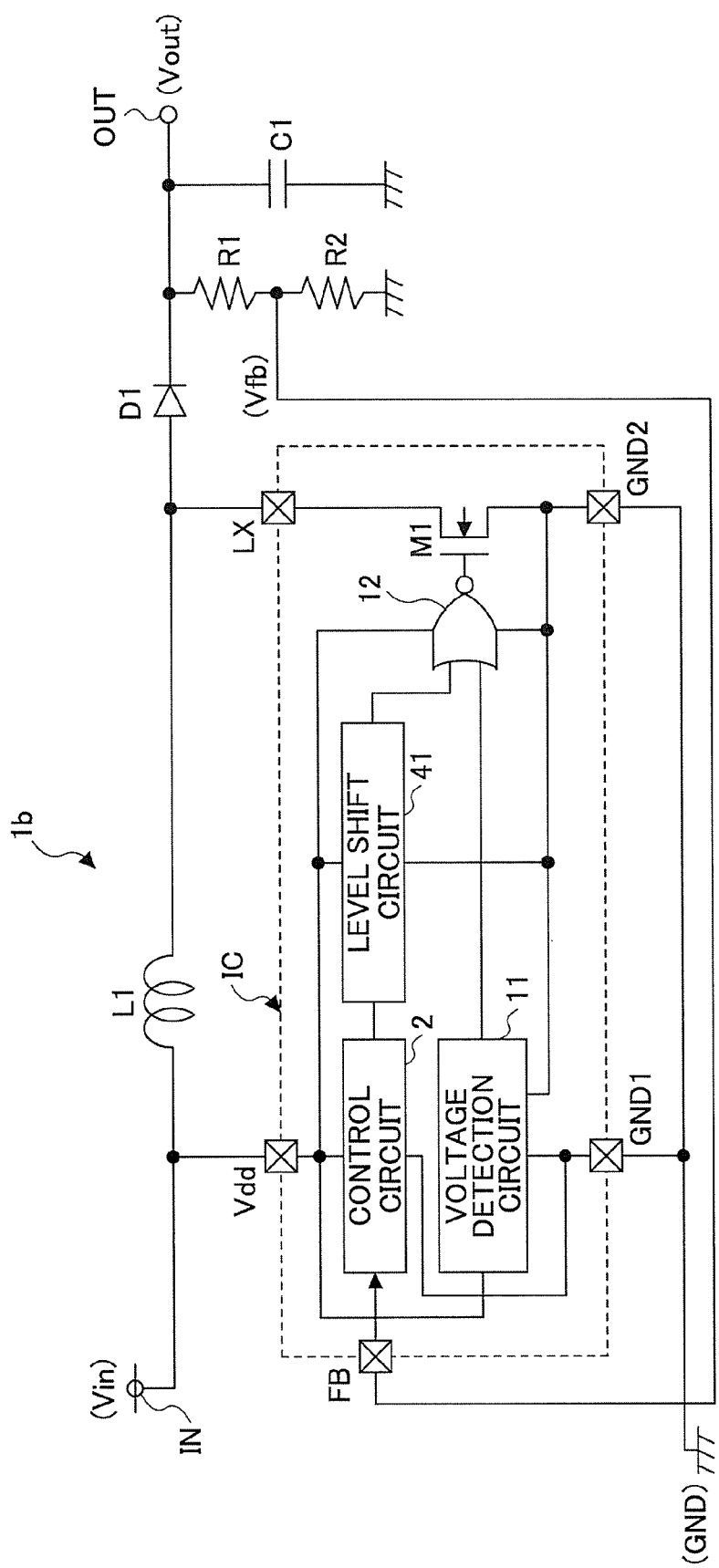
FIG. 4 is a schematic diagram showing an exemplary configuration of a switching regulator according to a third embodiment of the present invention.
Figure 5:
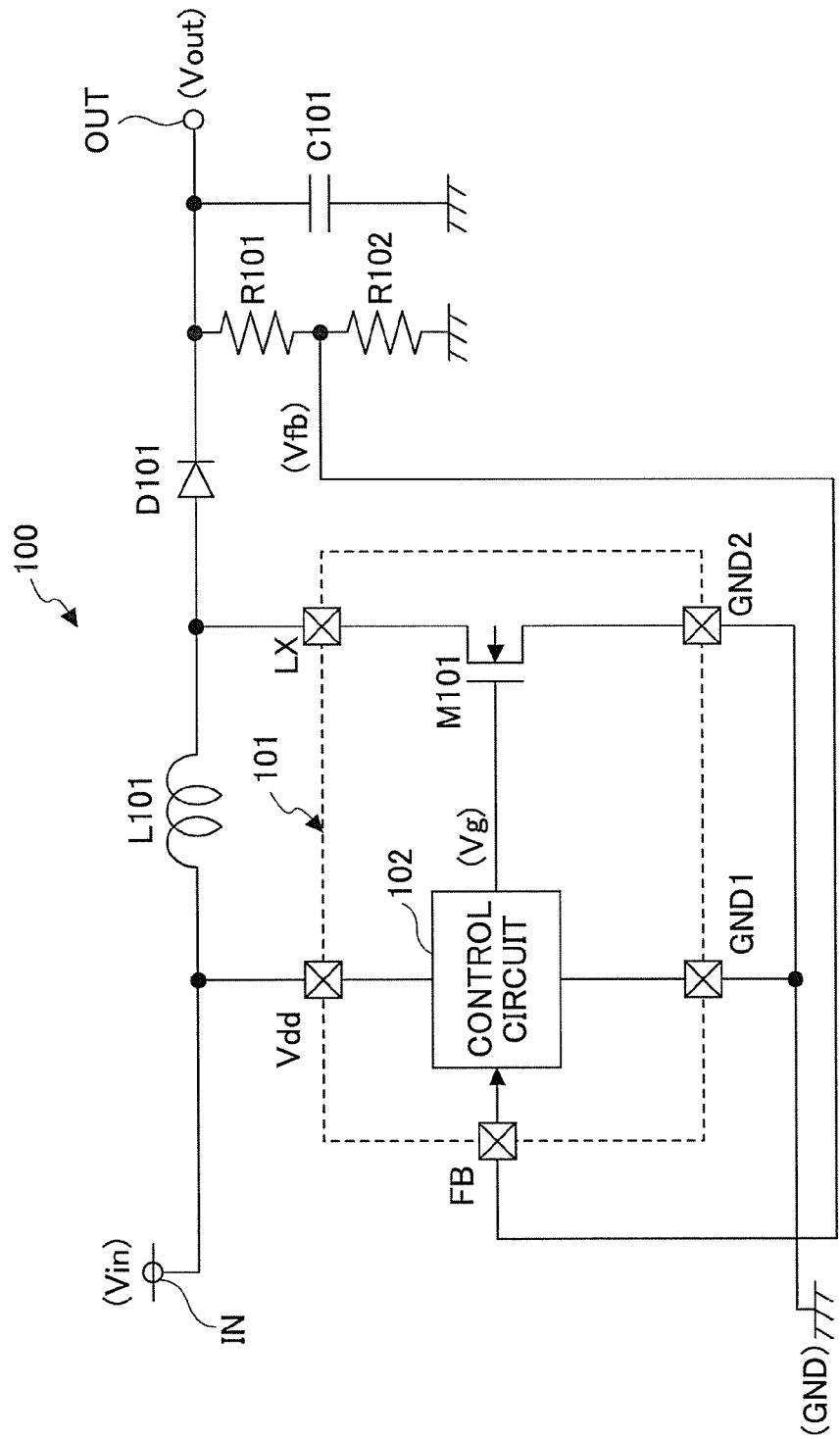
FIG. 5 is a schematic diagram showing a configuration of a conventional switching regulator.

FIG. 4 shows a configuration of an exemplary switching regulator according to the third embodiment of the present invention. In FIG. 4, the same reference numerals are used to refer to the same or similar parts as those in FIG. 2, and the descriptions of those parts are omitted. Namely, only a portion different from the configuration in FIG. 2 is described.

The portion in FIG. 4 different from that in FIG. 2 is a level shift circuit 41 that is added between the control circuit 2 and the NOR circuit 12 shown in FIG. 2. Along with this change, the reference numeral of the switching regulator is also changed from 1a (in FIG. 2) to 1b (in FIG. 4).

In FIG. 4, a switching regulator 1b is a step-up switching regulator stepping up an input voltage Vin input to an input terminal IN to a prescribed voltage to be output as an output voltage Vout from an output terminal OUT.

The switching regulator 1b includes the switching transistor M1, the rectifying diode D1, the inductor L1, the capacitor C1, the resistors R1 and R2, the control circuit 2 controlling the operation of the switching transistor M1, the voltage detection circuit 11, the NOR circuit 12, and a level shift circuit 41 level-shifting the output signal from the control circuit 2 so that the signal has an amplitude between the input voltage Vin and the voltage of the second ground terminal GND2.

It should be noted that the voltage detection circuit 11, the NOR circuit 12, and the level shift circuit 41 constitute a protection circuit unit, and the NOR circuit 12 and the level shift circuit 41 constitute an output control circuit unit. Further, the switching transistor M1, the control circuit 2, the voltage detection circuit 11, the NOR circuit 12, and the level shift circuit 41 are formed into a single IC. The IC includes the power terminal Vdd, connection terminals LX and FB, the first ground terminal GND1, and the second ground terminal GND2, the first ground terminal GND1 and the second ground terminal GND2 being connected to each other outside the IC and being further connected to ground potential GND.

The level shift circuit 41 is connected between the output terminal of the control circuit 2 and the corresponding input terminal of the NOR circuit 12. The level shift circuit 41 is connected to the power terminal Vdd and the second ground terminal GND2 to receive power.

In this configuration, the level shift circuit 41 level-shifts the signal having an amplitude between the input voltage Vin and the voltage of the first ground terminal GND1 from the control circuit 2 to the signal having an amplitude between the input voltage Vin and the voltage of the second ground terminal GND2 and then outputs the level-shifted signal to the corresponding input terminal of the NOR circuit 12.

When the high-level signal from the voltage detection circuit 11 is input to the NOR circuit 12, the NOR circuit 12 outputs a low-level signal regardless of the status of the signal from the level shift circuit 41. The voltage of the low-level signal from the NOR circuit 12 is that of the second ground terminal GND2. The signal is input to the gate of the switching transistor M1 to turn OFF the switching transistor M1 to be electrically non-conducting. On the other hand, when a low-level signal from the voltage detection circuit 11 is input to the NOR circuit 12, the NOR circuit 12 inverts the level of the input signal from the level shift circuit 41 and outputs a signal having the inverted level to the gate of the switching transistor M1.

As described above, in a switching regulator according to the third embodiment of the present invention, since a signal from the control circuit 2 is level-shifted to a signal having an amplitude between the input voltage Vin and the voltage of the second ground terminal GND2 and the level-shifted signal is input to the corresponding input terminal of the NOR circuit 12, the same effect as that in the second embodiment of the present invention can be obtained. Also, when the connection between the first ground terminal GND1 and ground potential GND1 is cut off, the switching transistor M1 is more securely turned OFF to be electrically non-conducting.

The present invention is not limited to the above-mentioned embodiments, and variations and modifications may be made without departing from the scope of the present invention.

The present application is based on and claims the benefit of priority of Japanese Patent Application No. 2006-342506, filed on Dec. 20, 2006, the entire contents of which are hereby incorporated by reference.

What is claimed is:

1. A switching regulator converting an input voltage input to an input terminal thereof to a prescribed substantially constant voltage and outputting the converted voltage from an output terminal thereof as an output voltage, the switching regulator comprising:
   a switching transistor performing a switching operation based on a control signal input to the switching transistor;
   an inductor charged by the input voltage based on the switching operation of the switching transistor;
   a control circuit unit performing a switching control of the switching transistor so that the output voltage output from the output terminal is substantially equal to the prescribed substantially constant voltage;
   a first ground terminal for connecting the control circuit unit to a ground potential;
   a second ground terminal for connecting the switching transistor to the ground potential; and
   a protection circuit unit for turning OFF the switching transistor to be electrically non-conducting regardless of a status of a control signal output from the control circuit unit when a disconnection between the first ground terminal and the ground potential is detected.

2. The switching regulator according to claim 1, wherein the protection circuit unit determines that the connection between the first ground terminal and the ground potential is cut off when the voltage of the first ground terminal is higher than the voltage of the second ground terminal by a prescribed value.

3. The switching regulator according to claim 1, wherein the protection circuit unit includes a transistor having a control electrode connected to the first ground terminal, the transistor being turned ON when the connection between the first ground terminal and the ground potential is cut off and the voltage of the first ground terminal is increased to apply a predetermined voltage to the control electrode of the switching transistor so that the switching transistor is turned OFF to be electrically non-conducting.

4. The switching regulator according to claim 1, wherein the protection circuit unit determines that the connection between the first ground terminal and the ground potential is cut off when the voltage of the first ground terminal is equal to or higher than a first prescribed value.

5. The switching regulator according to claim 1, wherein one end of the inductor is connected to the input terminal; the switching transistor is connected to the junction between the other end of the inductor and the second ground terminal; and a rectifying device is connected between the junction between the other end of the inductor and the second ground terminal and the output terminal.

6. The switching regulator according to claim 1, wherein the switching transistor, the control circuit unit, and the protection circuit unit are formed into a single IC; and each of the first ground terminal and the second ground terminal is connected to a corresponding terminal of the IC.

7. The switching regulator according to claim 4, wherein the first prescribed value is less than a threshold voltage of the switching transistor.

8. The switching regulator according to claim 4, wherein the protection circuit includes
   a voltage detection circuit comparing a voltage of the first ground terminal with the first prescribed value and outputting a signal representing the comparison result; and
   an output control circuit performing an output control to control the control signal output from the control circuit unit to the control electrode of the switching transistor based on the output signal from the voltage detection circuit, wherein
   the voltage detection circuit generates and outputs a prescribed error detection signal when the voltage of the first ground terminal is higher than the first prescribed value and, when the prescribed error detection signal is output from the voltage detection circuit, the output control circuit interrupts the output of the control signal from the control circuit unit to the control electrode of the switching transistor to turn OFF the switching transistor to be electrically non-conducting.

9. The switching regulator according to claim 8, wherein the output control circuit level-shifts a signal to the control electrode of the switching transistor from a voltage referred to the voltage of the first ground terminal to a voltage referred to the voltage of the second ground terminal.

10. A semiconductor device including a chopper-type switching regulator using an inductor, the switching regulator converting an input voltage input to an input terminal thereof to a prescribed substantially constant voltage and outputting the converted voltage from an output terminal thereof as an output voltage, the semiconductor device comprising:
   a switching transistor performing a switching operation based on a control signal input to the switching transistor and causing the inductor to be charged by the input voltage;
   a control circuit unit performing a switching control of the switching transistor so that the output voltage output from the output terminal is substantially equal to the prescribed substantially constant voltage;
   a first ground terminal for connecting the control circuit unit to a ground potential;
   a second ground terminal for connecting the switching transistor to the ground potential; and
   a protection circuit unit for turning OFF the switching transistor to be electrically non-conducting regardless of a status of a control signal output from the control circuit unit when a disconnection between the first ground terminal and the ground potential is detected.

11. The semiconductor device according to claim 10, wherein
   the protection circuit unit determines that the connection between the first ground terminal and the ground potential is cut off when the voltage of the first ground terminal is higher than the voltage of the second ground terminal by a prescribed value.

12. The semiconductor device according to claim 10, wherein
   the protection circuit unit includes a transistor having a control electrode connected to the first ground terminal, the transistor being turned ON when the connection between the first ground terminal and the ground potential is cut off and the voltage of the first ground terminal is increased to apply a predetermined voltage to the control electrode of the switching transistor so that the switching transistor is turned OFF to be electrically non-conducting.

13. The semiconductor device according to claim 10, wherein
   the protection circuit unit determines that the connection between the first ground terminal and the ground potential is cut off when the voltage of the first ground terminal is equal to or higher than a first prescribed value.

14. The semiconductor device according to claim 10, wherein
   one end of the inductor is connected to the input terminal; the switching transistor is connected to the junction between the other end of the inductor and the second ground terminal; and a rectifying device is connected between the junction between the other end of the inductor and the second ground terminal and the output terminal.

15. The semiconductor device according to claim 10, wherein
   the switching transistor, the control circuit unit, and the protection circuit unit are formed into a single IC; and each of the first ground terminal and the second ground terminal is connected to a corresponding terminal of the IC.

16. The semiconductor device according to claim 13, wherein
   the first prescribed value is less than a threshold voltage of the switching transistor.

17. The semiconductor device according to claim 13, wherein
   the protection circuit includes
      a voltage detection circuit comparing a voltage of the first ground terminal with the first prescribed value and outputting a signal representing the comparison result; and
      an output control circuit performing an output control to control an output from the control circuit unit to the control electrode of the switching transistor based on the output signal from the voltage detection circuit, wherein
   the voltage detection circuit generates and outputs a prescribed error detection signal when the voltage of the first ground terminal is higher than the first prescribed value and, when the prescribed error detection signal is output from the voltage detection circuit, the output control circuit interrupts the output of a control signal from the control circuit unit to the control electrode of the switching transistor to turn OFF the switching transistor to be electrically non-conducting.

18. The semiconductor device according to claim 17, wherein the output control circuit level-shifts a signal to the control electrode of the switching transistor from a voltage referred to the voltage of the first ground terminal to a voltage referred to the voltage of the second ground terminal.

* * * * *